United States Patent [19]  [11] 4,393,128
Shiba et al.  [45] Jul. 12, 1983

[54] LIGHT-SENSITIVE LITHOGRAPHIC PRINTING PLATE PRECURSOR

[75] Inventors: Keisuke Shiba; Sho Nakao; Tadao Toyama, all of Shizuoka, Japan

[73] Assignee: Fuji Photo Film Co., Ltd., Kanagawa, Japan

[21] Appl. No.: 299,421

[22] Filed: Sep. 4, 1981

[30] Foreign Application Priority Data

Sep. 8, 1980 [JP] Japan .................................. 55-124358

[51] Int. Cl.³ ............................................. G03C 1/76
[52] U.S. Cl. ..................................... 430/273; 430/278; 430/156; 430/165; 430/166; 430/167; 430/302; 430/306; 430/611; 430/631
[58] Field of Search ............... 430/273, 278, 156, 165, 430/166, 167, 302, 306, 611, 631

[56] References Cited

U.S. PATENT DOCUMENTS

| | | | |
|---|---|---|---|
| 3,310,405 | 3/1967 | Müller-Bardorff | 430/640 |
| 4,168,167 | 9/1979 | Takenaka et al. | 430/264 |
| 4,221,858 | 9/1980 | Shiba et al. | 430/302 |
| 4,268,609 | 5/1981 | Shiba et al. | 430/156 |

*Primary Examiner*—Won H. Louie, Jr.
*Attorney, Agent, or Firm*—Sughrue, Mion, Zinn, Macpeak and Seas

[57] ABSTRACT

The formation of spots when making a printing plate using a presensitized printing plate comprising a silver halide light-sensitive layer formed on an aluminum support having an aluminum oxide film on the surface directly or over a non-silver light-sensitive intermediate layer is effectively prevented by incorporating a mercapto compound in one of the layers.

11 Claims, No Drawings

LIGHT-SENSITIVE LITHOGRAPHIC PRINTING PLATE PRECURSOR

FIELD OF THE INVENTION

This invention relates to a light-sensitive lithographic printing plate precursor (hereinafter, such a precursor is referred to as presensitized printing plate, which is abbreviated as "PS plate") comprising a silver halide-containing light-sensitive layer formed on an aluminum support having an aluminum oxide film on the surface thereof, and more particularly to an improved presensitized plate having the above-described structure, which is not accompanied by the formation of spots during the plate making process and results in a lithographic printing plate that provides prints having excellent image quality.

BACKGROUND OF THE INVENTION

Presensitized printing plates composed of an aluminum support having an aluminum oxide film on the surface thereof and a silver halide-containing light-sensitive layer formed on the support directly or over a non-silver light-sensitive intermediate layer are known, as disclosed, for example, in British Pat. Nos. 1,571,155, 1,567,844 and 1,227,603.

However, in such presensitized printing plates the formation of spots frequently occurs during the plate making process, due, presumably, to direct or indirect interaction between the metallic aluminum of the aluminum support and silver halide grains. It has further been found that this phenomenon is particularly serious in the case of a plate making process using a presensitized printing plate which has been stored under a high humidity condition for a long period of time.

SUMMARY OF THE INVENTION

An object of this invention, therefore, is to provide a presensitized printing plate which does not exhibit spots as described above.

More particularly, the object of this invention is to provide an improved presensitized printing plate composed of an aluminum support having an aluminum oxide film on the surface thereof and a silver halide-containing light-sensitive layer formed on the support, which does not result in spots formed during the process of making a printing plate from the presensitized printing plate.

Another object of this invention is to provide a presensitized printing plate comprising an aluminum support having an aluminum oxide film on the surface thereof and having successively formed thereon a non-silver light-sensitive layer and a silver halide-containing light-sensitive layer, which does not result in spots formed during the process of making a printing plate from the presensitized printing plate, and can provide a lithographic printing plate giving prints having good quality.

A further object of this invention is to provide a presensitized printing plates as described above having an excellent shelf life.

As the result of various investigations, it has now been found that the above-mentioned objects can be attained by incorporating an organic mercapto compound in at least one layer of presensitized printing plates as described above.

That is, according to this invention, there is provided a light-sensitive lithographic printing plate precursor comprising an aluminum support having an aluminum oxide film on the surface thereof, wherein the mean weight of said aluminum oxide film being at least 1 g/m$^2$, at least one layer on said support containing an organic mercapto compound, and the total amount of said compound being at least 1 millimol per mol of the silver halide.

In the present invention, the expression "mean weight" is used for aluminum oxide film due to the fact that the aluminum oxide film is, strictly speaking, not uniform in its thickness.

DETAILED DESCRIPTION OF THE INVENTION

In the case of presensitized printing plates wherein a silver halide-containing light-sensitive layer is formed on an aluminum support, the formation of spots on images formed by the aforesaid silver halide-containing light-sensitive layer is greatly reduced by forming an aluminum oxide film on the surface of the aluminum support, and the reduction in spot formation is particularly remarkable in the case of forming an aluminum oxide film over 1 g/m$^2$, but the effect is not completely satisfactory for practical purposes. In particular, when the presensitized printing plate is preserved for a long period of time, spots still form greatly.

When a mercapto compound is incorporated in the silver halide-containing light-sensitive layer formed on a paper support or a plastic support, the number of spots is not significantly reduced, although the size of spots is reduced.

However, it has now surprisingly been found according to this invention that when a mercapto compound is incorporated in at least one layer formed on an aluminum support having an aluminum oxide film of at least 1 g/m$^2$ in mean weight on the surface thereof in an amount of at least 1 millimol per mol of the silver halide, the formation of spots is effectively prevented. In a presensitized printing plate having another layer(s) in addition to a silver halide-containing light-sensitive layer, such as, for example, a non-silver light-sensitive layer or a protective layer, the formation of spots can be prevented by incorporating a mercapto compound in such other layer(s).

The mercapto compound used in this invention is an organic compound having mercapto group, and includes mercapto compounds as described, for example, in C.E.K. Mees and T. H. James, *The Theory of the Photographic Process*, 3rd Edition (1966), and U.S. Pat. Nos. 2,697,040, 2,476,536, 1,758,576, 2,304,962, 2,843,491, 2,697,079, and 2,824,001. Among these compounds, mercaptotetrazoles, mercaptotriazoles, and mercaptodiazoles are particularly preferred.

More particularly, mercapto compounds according to formulae (I) to (IV) below are preferably used as the mercapto compound in this invention:

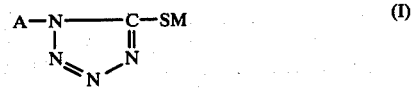

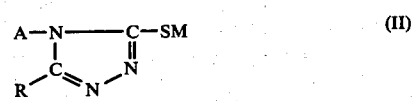

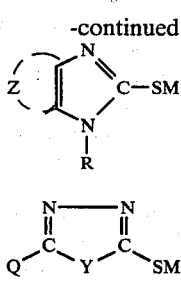

wherein M represents a hydrogen atom or an alkali metal atom; A represents an aryl group or a substituted aryl group; R represents a hydrogen atom, an alkyl group, or a substituted alkyl group; Z represents an atomic group completing an aromatic ring which may be substituted; Y represents a divalent hetero atom; and Q represents —SM, an amino group, an alkylamino group; an —SR group, or an —OR group.

Examples of the alkali metal atom shown by M in the above formulae include sodium and potassium. As the aryl group shown by A, monocyclic aryl groups (e.g., a phenyl group) are preferred, and examples of the substituent for the aryl group include an alkyl group having from 1 to 5 carbon atoms (e.g., a methyl group, an ethyl group, a propyl group, an isopropyl group, a butyl group, an amyl group, etc.), an alkoxy group having from 1 to 5 carbon atoms (e.g., a methoxy group, an ethoxy group, a propoxy group, etc.), a halogen atom (e.g., a chlorine atom, a bromine atom, etc.), and an alkanecarboamido group having from 2 to 5 carbon atoms (e.g., a pentacarboamido group, etc.). Also, as the alkyl group shown by R, alkyl groups having from 1 to 8 carbon atoms (e.g., a methyl group, an ethyl group, a propyl group, an isopropyl group, a butyl group, a t-butyl group, a pentyl group, a hexyl group, a 2-ethylhexyl group, etc.) are preferred, and examples of the substituent for the alkyl group include an alkoxy group having from 1 to 4 carbon atoms, a halogen atom, and a hydroxy group. As the aromatic ring shown by Z, a benzene ring and a naphthalene ring are preferred, and examples of the substituent for the aromatic ring include an alkyl group having from 1 to 4 carbon atoms (e.g., a methyl group, an ethyl group, a propyl group, a butyl group, etc.), an alkoxy group having from 1 to 4 carbon atoms (e.g., a methoxy group, an ethoxy group, etc.), a halogen atom (e.g., a chlorine atom, a bromine atom, etc.), a carboxy group, a sulfo group, etc. Examples of the hetero atom Y include —S—, —O—, etc. Also, as the alkylamino group shown by Q, a group having from 1 to 8 carbon atoms is preferred, and R of —SR and —OR has the same meaning as described for R in the above formula (I) to (IV).

Among the mercapto compounds used in this invention, compounds of formulae (I) and (IV) are particularly preferred.

Specific examples of mercapto compounds useful in this invention are illustrated below:

(1) 1-Phenyl-5-mercaptotetrazole
(2) 1-(3-Pentacarboamidophenyl)-5-mercaptotetrazole
(3) 3-Mercapto-4-phenyl-1,2,4-triazole
(4) 3-Mercapto-5-methyl-4-phenyl-1,2,4-triazole
(5) 3,4-Dimethyl-5-mercapto-1,2,4-triazole
(6) 2-Mercapto-5-methylmercapto-1,3,4-thiadiazole
(7) 2-Amino-5-mercapto-1,3,4-thiadiazole
(8) 2-Mercaptobenzothiazole
(9) 2-Mercaptobenzimidazole
(10) 2-Mercapto-5-methylbenzoylimidazole
(11) 2-Mercapto-5-sulfobenzimidazole sodium salt Among these compounds, compounds (1), (2), (6), and (7) are particularly preferred.

The mercapto compound is dissolved in a water-soluble organic solvent such as methanol, ethanol, 2-methoxy ethanol, etc., or an organic solvent such as methyl ethyl ketone, etc., and is directly added to a coating composition for forming a silver halide-containing light-sensitive layer or another layer, such as a non-silver light-sensitive layer. A suitable amount of the mercapto compound is generally from 1 to 50 millimols, and more preferably from 1 to 20 millimols, per mol of silver halide.

The aluminum support used in this invention has an aluminum oxide film on the surface, and the oxide film is preferably formed by an anodic oxidation treatment.

The aforesaid anodic oxidation treatment is performed by passing an electric current through an aluminum plate in an aqueous solution or a non-aqueous solution of an inorganic acid such as phosphoric acid, chromic acid, sulfuric acid, boric acid, etc.; an organic acid such as oxalic acid, sulfamic acid, etc.; or a salt of an acid, singly or as a mixture of two or more acids or salts, and preferably in an aqueous solution of phosphoric acid or sulfuric acid, or a mixture of said acids.

Particularly preferred conditions for the anodic oxidation treatment are disclosed, for example, in British Pat. No. 1,412,768 and U.S. Pat. No. 4,211,619. Also, an aluminum plate electrolyzed in a hydrochloric acid electrolyte by an alternating current and then anodically oxidized in a sulfuric acid electrolyte as described in British Pat. No. 1,208,224 can preferably be used in this invention.

Aluminum plates that can be used in the invention include: an aluminum plate subjected to a graining treatment or to an immersion treatment in an aqueous solution of sodium silicate, potassium fluorozirconate, a phosphate, etc.; an aluminum plate subjected to an immersion treatment in an aqueous solution of sodium silicate after being grained as described in U.S. Pat. No. 2,714,066; or an aluminum plate subjected to an anodic oxidation treatment and then to an immersion treatment in an aqueous solution of an alkali metal silicate as described in U.S. Pat. No. 3,181,461. Furthermore, it is preferred for preventing the formation of scum during printing to form a subbing layer of a cellulosic resin containing a water-soluble salt of a metal such as zinc as described in U.S. Pat. No. 3,860,426 on the aluminum plate anodically oxidized by the process described above.

The silver halide-containing light-sensitive layer formed on such an aluminum support directly or over a non-silver light-sensitive layer may be an ordinary negative-type silver halide emulsion or a direct positive-type silver halide emulsion. Examples of the silver halide used include silver chloride, silver bromide, silver iodide and mixed silver halides thereof. It is preferred that the mean grain size of the silver halide be from about $0.01\mu$ to about $5\mu$. For imparting proper sensitivity to the silver halide grains, a chemical sensitization technique, such a sulfur sensitization, reduction sensitization, or sensitization by a salt of a noble metal such as Ir, Rh, Pt, etc., or a spectral sensitization by sensitizing dyes can be applied to the silver halide grains. The silver halide grains may be surface latent image-type grains or internal latent image-type grains. To these silver halide emulsions may be added additives usually used for silver halide emulsions.

Preferred light-sensitive silver halide emulsions formed directly on the aforesaid aluminum support are disclosed in British Pat. Nos. 1,571,155 and 1,567,844 and U.S. Pat. No. 4,168,167, and plate making processes for the presensitized printing plates using such silver halide emulsions are also described in detail therein.

Also, preferred light-sensitive silver halide emulsions formed on the aforesaid aluminum support over a non-silver light-sensitive layer are described in Japanese Patent Application Nos. 74258/79, 90053/79, 136729/79, 126970/79 and 148368/79.

The light-sensitive silver halide emulsion may be coated on the aluminum support at a dry coverage of from about 1 to 10 g/m$^2$, and preferably from 2 to 6 g/m$^2$. For coating the silver halide emulsion, dip coating, air knife coating, curtain coating, as well as hopper coating and extrusion coating described in U.S. Pat. No. 2,681,294 can be employed.

On the other hand, as the non-silver light-sensitive layer used in an embodiment of this invention, light-sensitive layers used for ordinary light-sensitive lithographic printing plate precursors or presensitized printing plates may be used and oleophilic images can be formed in the light-sensitive layer. The term "oleophilic" in the aforesaid "oleophilic image" refers to a property of repelling an aqueous damping or fountain solution while being receptive for oily ink.

Examples of such non-silver light-sensitive layers include (1) a light-sensitive layer composed of a diazo resin, (2) a light-sensitive layer composed of an o-quinonediazide, (3) a light-sensitive layer composed of a light-sensitive azide compound, (4) a light-sensitive layer composed of a polymer having a group —CH=CH—CO— in the main chain or a side chain of the polymer, and (5) a light-sensitive layer composed of an addition polymerizable unsaturated compound, a photopolymerization initiator, and a polymer as a binder and they are described in British Patent Application 2,039,309 A. A composition for the non-silver light-sensitive layer is dissolved in an organic solvent and coated on the aluminum support at a dry coverage of from about 0.1 to 5 g/m$^2$ by a known coating method.

In a particularly preferred embodiment of this invention, a light-sensitive silver halide emulsion layer is formed on the above-described non-silver light-sensitive layer.

A lithographic printing plate can be produced in the following manner using a light-sensitive lithographic printing plate precursor of this invention. The light-sensitive silver halide-containing lithographic printing plate precursor is first image-exposed to form a latent image in the light-sensitive layer containing the silver halide. Then, the silver halide emulsion is developed (first development) and is directly or after fixing exposed to actinic rays including ultraviolet rays. Thereafter, the plate is subjected to a second development to dissolve off selectively the non-image portions only of the non-silver light-sensitive layer, thereby disclosing the hydrophilic surface of the support at the non-image portions, to provide a printing plate. In this case the processing solution used for the second development is a solution capable of selectively dissolving the non-image portions only of the non-silver light-sensitive layer, and developer used for developing ordinary presensitized printing plates is preferably used. For example, in case of a presensitized printing plate wherein the non-silver light-sensitive layer is a layer composed of an o-quinonediazide compound, a developer described in U.S. Pat. No. 4,259,434, such as an aqueous solution of sodium silicate or the developer described in U.S. Pat. No. 4,141,733 is useful.

As another process, a step of washing away the light-sensitive silver halide emulsion layer on the non-silver light-sensitive layer wholly, or at the non-imaged portions only, after an ultraviolet exposure may be employed. Thereafter, the plate is treated with the second developer to selectively dissolve off the non-imaged portions only.

The features of this invention relate to the problem of spot formation. When a silver halide light-sensitive layer is formed directly on the surface of a metallic aluminum as a support, fogs form. However, by forming an aluminum oxide film on the surface of the aluminum plate by, e.g., an anodic oxidation treatment, the formation of fog can be significantly reduced. It has been found that even for a grained aluminum support, the formation of fog can be almost completely prevented by covering the aluminum support with an aluminum oxide film (over 1 g/m$^2$) as uniformly as possible. However, when the presensitized printing plate is stored for a long period of time, spots form by development of silver halide. The formation of the spots cannot be prevented by using compounds usually used as spot preventing agents for ordinary silver halide emulsions, e.g., the aldoxime compounds described in U.S. Pat. No. 3,310,405. However, it has been found that by using a mercapto compound according to this invention, the formation of the spots can be prevented. A mercapto compound forms precipitate of a sparingly soluble mercapto silver salt with a silver ion, and is also used as antifoggant. However, by using, for example, 5-bromobenzotriazole, 6-nitrobenzotriazole, etc., which form a sparingly soluble silver salt with a silver ion, and are used as antifoggant, as in the case of the mercapto compound, the formation of the spots cannot be prevented. In other words, by applying the combination of the use of the mercapto compound and the formation of an aluminum oxide film according to this invention, the formation of the spots can be very effectively prevented. By forming a non-silver light-sensitive layer on the aluminum oxide film before forming a silver halide light-sensitive layer, the formation of the spots can be even more effectively prevented.

Below, the invention will be further explained by examples, in which percents are all by weight.

EXAMPLE 1

A mechanically grained aluminum plate was immersed for 1 minute in an aqueous 2% sodium hydroxide solution maintained at 40° C. to corrode a part of the surface. After washing with water, the aluminum plate was immersed for about 1 minute in a solution of sulfuric acid and chromic acid, thereby the pure aluminum surface was exposed. The plate was then immersed in a 20% sulfuric acid solution maintained at 30° C. and after applying an anodic oxidation treatment for 2 minutes under conditions of a d.c. voltage of 1.5 volt and a current density of 3 amp./dm$^2$, the plate was washed with water and dried. Then, a light-sensitive liquid having the following composition was continuously coated on the aluminum plate at a dry coverage of 2 g/m$^2$ by means of an extrusion-type doctor.

| | |
|---|---|
| Naphthoquinone-1,2-diazido(2)-5-sulfonic acid ester of acetone-pyrogallol resin (made by the method of Example 1 in U.S. Pat. No. 3,635,709) | 2.5 g |
| Cresol-formaldehyde resin | 5.0 g |
| Methyl ethyl ketone | 75 g |
| Cyclohexanone | 60 g |

Then each of the silver halide emulsions having the following Compositions A to E was continuously and uniformly coated on the aluminum plate at a dry coverage of 4.0 g/m² by means of an extrusion-type doctor and then dried for 3 minutes by hot blast of air at 80° C. to provide Samples A to E.

Composition A

| | |
|---|---|
| Emulsion prepared by dissolving 25 g of phenol-formaldehyde resin MP-120 HH (made by Gunei Kagaky Kogyo K.K.) and 25 g of dioctyl adipate in mixture of 330 g of ethyl acetate and 120 g of methyl ethyl ketone and dispersing the solution in a mixture of 600 ml of aqueous 10% gelatin solution, 60 ml of 10% solution of sodium nonylbenzenesulfonate, and 150 ml of 10% methanol solution of Turkey red oil | 1,300 g |
| Gelatino silver chlorobromide emulsion (silver chlorobromide of 70 mol % of Cl⁻ and 30 mol % of Br⁻, mean grain size of 0.28μ, containing 55 g of gelatin and 0.85 mol of silver halide per kg of the emulsion) | 2,000 g |
| 0.1% Methanol solution of 1,3-diethyl-5-{2-[3-(3-sulfopropyl)benzoxazole-2-iridene]ethylidene}thiohydantoin sodium salt | 100 ml |
| 0.5% Aqueous solution of 4-hydroxy-6-methyl-1,3,3a,7-tetraazaindene | 200 ml |
| 1% Aqueous solution of glyoxal | 20 ml |

Compositions B–E

Compositions B–E were prepared by adding the following compounds as indicated to aforesaid Composition A followed by stirring for 30 minutes.

Composition B

1% Methanol solution of 1-phenyl-5-mercaptotetrazole 70 ml

Composition C

1% Methanol solution of 2-mercapto-5-methylmercapto-1,3,4-thiadiozole 65 ml

Composition D

1% Methanol solution of 5-bromobenzotriazole 78 ml

Composition E

1% Methanol solution of 2-diethylamino-4,6-dihydroxyamino-1,3,5-triazine 90 ml

Each of Samples A to E, formed from Compositions A to E, respectively, was allowed to stand for 5 days under high temperature high humidity conditions of 50° C. and 80% RH, and then printing plates were prepared as follows.

Through a transparent negative film obtained by photographing a character image reduced to about 1/5 of the original size, the sample was exposed for 10 seconds at 5 times enlargement using an enlarger having a light source of 300 lux. Then, the sample was subjected to the following processing using an automatic processor. That is, the sample was passed through a first developing section containing Developer (I), having the composition shown below, over a 30 second period at 32° C., and then passed through a fixing section filled with Fix Solution (I), having the composition shown below, over a 10 second period at room temperature (about 20° C.). Then, the sample was passed through an ultraviolet exposure section having 3 reflection mercury lamps over a 15 second period, rubbed by a brush in a wash-out section while being immersed in water at 40°–45° C., passed through a squeeze roller, passed through a second development section filled with Developer (II), having the composition shown below, over a 30 second period at 30° C., and then coated with an aqueous gum arabic solution of 14° Be to provide a lithographic printing plate.

Composition of Developer (I)

| | |
|---|---|
| Water | 700 ml |
| Metol (p-methylaminophenol sulfate) | 3.0 g |
| Sodium sulfite | 45.0 g |
| Hydroquinone | 12.0 g |
| Sodium carbonate (monohydrate) | 80.0 g |
| Potassium bromide | 2 g |
| Water to make | 1 l |

The liquid composition of Developer (I) was diluted with water for use (at a ratio of Developer (I): water = 1.2 by volume).

Developer (II)

| | |
|---|---|
| Sodium silicate (JIS #1) | 100 g |
| Sodium metasilicate | 50 g |
| Pure water | 1,800 ml |

Fix Solution (I)

| | |
|---|---|
| Water | 700 ml |
| Ammonium thiosulfate | 224 g |
| Sodium sulfite | 20 g |
| Water to make | 1,000 ml |

Using each printing plate thus-obtained, press printing was commenced on a Heidel KOR press.

In the case of using the lithographic printing plates prepared from Samples B and C, good prints were obtained with 4–5 test prints, and about 110,000 prints were obtained.

On the other hand, in the case of lithographic printing plates prepared from samples A, D, and E, the spots formed during the first development in the silver halide emulsion layer remained even on the last print in the non-image area, and hence satisfactory prints could not be obtained.

EXAMPLE 2

Aluminum plates were treated as in Example 1 and subjected to an anodic oxidation treatment as in Example 1 for differing times so that the weight of the oxide film formed was from 0 to 3.0 g/m², to provide supports. On each of the supports a light-sensitive layer was formed containing naphthoquinone-1,2-diazido-(2)-

5-sulfonic acid ester as the main component, as in Example 1.

Then, each of the silver halide light-sensitive emulsions having Composition A as in Example 1 and Compositions F to I shown below was coated on the light-sensitive layer described above at a dry coverage of 4.0 g/m² to provide Samples A and F to I.

Compositions F-I

Each of the compositions was prepared by adding a 1% methanol solution of 1-phenyl-5-mercaptotetrazole to Composition A in the amount shown below.

| Composition | Amount | |
|---|---|---|
| F | 10 ml | (0.33 mmol/mol-silver halide) |
| G | 30 ml | (1 mmol/mol-silver halide) |
| H | 70 ml | (2.3 mmol/mol-silver halide) |
| I | 150 ml | (5 mmol/mol-silver halide) |

After allowing each sample thus-obtained to stand for 5 days under high temperature and high humidity conditions of 50° C. and 80% RH, each sample was developed in the same manner as in Example 1 without performing imagewise exposure.

The number of spots formed per cm² of the developed aluminum plates are shown in the following table.

| Amount of Oxide Film (g/m²) | Composition of Silver Halide Emulsion | | | | |
|---|---|---|---|---|---|
| | A | F | G | H | I |
| 0 | 30 | 10 | 2 | 2 | 1 |
| 0.5 | 15 | 5 | 1 | 1 | 0 |
| 1 | 6 | 2 | 0 | 0 | 0 |
| 2 | 3 | 0 | 0 | 0 | 0 |
| 3 | 2 | 0 | 0 | 0 | 0 |

EXAMPLE 3

An aluminum plate (2S) of 0.24 mm thick was immersed for 2 minutes in a 5% aqueous solution of sodium tertiary phosphate for degreasing. The plate was then washed with water and after graining the surface thereof using a nylon brush and an aqueous suspension of pumice of 400 mesh, the plate was washed with water and etched in an aqueous 10% sodium hydroxide solution for 20 seconds at 50° C. The mean roughness was about 0.4μ. Thereafter, the plate was immersed in an aqueous 30% nitric acid solution for 20 seconds at room temperature. The plate was subjected to an anodic oxidation treatment for 5 minutes in a 15% sulfuric acid solution at a current density of 2 amp/dm² to form an oxide film of about 3 g/m². Then, the plate was etched in an aqueous solution of 10% phosphoric acid for 23 seconds at 58° C. The etched amount was about 0.8 g/m².

The plate was immersed in an aqueous solution of 2.4% sodium silicate (JIS #3) for 60 seconds at 70° C. and washed with water and dried. Then, a solution having the following composition was coated on the plate at a coverage of about 20 mg/m² and dried for 5 minutes at 120° C. to provide a support.

| | |
|---|---|
| 7.5% Aqueous solution of collodial silica (Ludox AM, made by E. I. Du Pont, mean grain size of 130-140 Å, containing 30% SiO₂) | 500 ml |
| Carboxymethyl cellulose (CMC) | 10 g |
| Gelatin | 10 g |
| Nickel acetate | 10 g |
| 10% Aqueous solution of citric acid | 20 ml |
| Water to make | 2 l |

A presensitized printing plate was prepared by forming a light-sensitive layer as described below on the support.

To 1 kg of a gelatino silver chlorobromide emulsion (containing 30 g of silver chlorobromide of 30 mol% silver chloride and 43 g of gelatin and had been ortho-sensitized) were added 10 g of 4-phenyl catechol (developing agent), 10 g of tricresyl phosphate, 10 g of vinyl chloride/vinyl acetate (84/16 mol %) copolymer, and 0.8 g of sodium nonylbenzenesulfonate (dispersing agent) and the mixture was dispersed in 30 g of ethyl acetate. To the emulsified dispersion was added an emulsion containing 20 g of fine polyethyl methacrylate particles (mean particle size of 0.2μ) obtained by an emulsion polymerization method, and the mixture was uniformly mixed. The composition thus-obtained was coated on the support at a dry coverage of 3 g/m², to provide Sample J.

On the other hand, to a second composition as described above was added 5.6 ml (about 2 mmol/mol-silver chlorobromide) of a 1% methanol solution of 2-mercapto-5-methylmercapto-1,3,4-thiadiazole, and the mixture was coated on a support in the same manner as above to provide Sample K.

Each of the samples thus-obtained was stored for 3 days at 50° C. and 80% RH and exposed for 3 seconds using an original of a microfilm of 1/5 in reduction ratio by a 5× enlarged projection. Then, the sample was developed for 45 seconds at 32° C. using a developer having the following composition, and washed out for 30 seconds with warm water at 40° C. to provide a relief image.

Composition of Developer

| | |
|---|---|
| Anhydrous sodium carbonate | 112.5 g |
| Potassium bromide | 1.5 g |
| Calgon (sodium polymetaphosphate, made by Calgon Inc.) | 1 g |
| Water to make | 1,000 ml |
| pH, 11.7 | |

Then, the plate was treated with an aqueous gum arabic solution of 14° Be to provide a lithographic printing plate. Using each of the printing plates thus-obtained, press printing was commenced on Heidel KOR press.

In case of using the printing plate obtained from Sample J, spots formed on every print in the non-imaged portions, and no satisfactory prints were obtained. On the other hand, in the case of using the printing plate obtained from Sample K, good prints were obtained from the commencement of printing, and 50,000 good prints were obtained.

EXAMPLE 4

Sample L was prepared in the same manner as in the case of preparing Sample A in Example 1, except that 0.12 g of 1-phneyl-5-mercaptotetrazole was added to the coating composition for the non-silver light-sensitive layer.

A lithographic printing plate was prepared in the same manner as in Example 1 using Sample L, and press printing was conducted using a printing plate formed therefrom. In this case, good prints, as in the case of the prints obtained from Sample B in Example 1, were obtained.

While the invention has been described in detail and with reference to specific embodiments thereof, it will be apparent to one skilled in the art that various changes and modifications can be made therein without departing from the spirit and scope thereof.

What is claimed is:

1. A light-sensitive lithographic printing plate precursor comprising an aluminum support having an aluminum oxide film on the surface thereof and having formed thereon a silver halide-containing light-sensitive layer, wherein the mean weight of said aluminum oxide film is at least 1 g/m$^2$, and at least one layer on said support contains a heterocyclic mercapto compound and the total amount of said compound is at least 1 millimol per mol of silver halide sufficient to prevent the formation of spots during the process of making a printing plate from said light sensitive lithographic printing plate precursor.

2. A light-sensitive lithographic printing plate precursor as in claim 1 comprising an aluminum support having an aluminum oxide film on the surface and having successively formed thereon a non-silver light-sensitive layer and a silver halide-containing light-sensitive layer, wherein at least one of the non-silver light-sensitive layer and the silver halide-containing light-sensitive layer contains said heterocyclic mercapto compound and the total amount of the heterocyclic mercapto compound contained in said layers is at least 1 millimol per mol of the silver halide sufficient to prevent the formation of spots during the process of making a printing plate from said light sensitive lithographic printing plate precursor.

3. A light-sensitive lithographic printing plate precursor as in claim 1 or 2, wherein said heterocyclic mercapto compound is selected from the group consisting of mercaptotetrazoles, mercaptotriazoles and mercaptodiazoles.

4. A light-sensitive lithographic printing prate precursor as in claim 1 ior 2, wherein said heterocyclic mercapto compound is represented by the formula (I), (II), (III), or (IV):

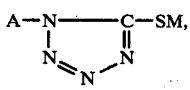 (I)

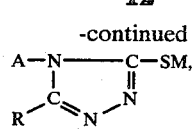 (II)

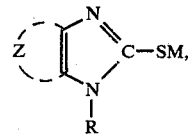 (III)

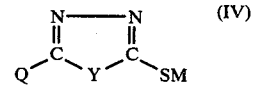 (IV)

wherein M represents a hydrogen atom or an alkali metal atom; A represents an aryl group or a substituted aryl group; R represents a hydrogen atom, an alkyl group, or a substituted alkyl group; Z represents an atomic group completing an aromatic ring which may be substituted; Y represents a divalent hetero atom; and Q represents —SM, an amino group, an alkylamino group, an —SR group, or an —OR group.

5. A light-sensitive lithographic printing plate precursor as in claim 4, wherein said heterocyclic mercapto compound can be represented by the formula (I).

6. A light-sensitive lithographic printing plate precursor as in claim 4, wherein said heterocyclic mercapto compound can be represented by the formula (IV).

7. A light-sensitive lithographic printing plate precursor as in claim 1 or 2, wherein said heterocyclic mercapto compound is selected from the group consisting of 1-phenyl-5-mercaptotetrazole, 1-(3-pentacarboamidophenyl)-5-mercaptotetrazole, 2-mercapto-5-methylmercapto-1,3,4-thiadiazole, and 2-amino-5-mercapto-1,3,4-thiadiazole.

8. A light-sensitive lithographic printing plate precursor as in claim 3, wherein said heterocyclic mercapto compound is used in an amount of from 1 to 50 millimoles per mole of silver halide.

9. A light-sensitive lighographic printing plate precursor as in claim 1 or 2, wherein said heterocyclic mercapto compound is used in an amount of from 1 to 20 millimoles per mole of silver halide.

10. A light-sensitive lithographic printing plate precursor as in claim 1 wherein said silver halide-containing light-sensitive layer is coated at a dry coverage of from about 1 to 10 g/m$^2$.

11. A light-sensitive lithographic printing plate precursor as in claim 2, wherein said silver halide-containing light-sensitive layer is coated at a dry coverage of from about 1 to 10 g/m$^2$ and said non-silver light-sensitive is coated at a dry coverage of from about 0.1 to 5 g/m$^2$.

* * * * *